(12) United States Patent
Huang et al.

(10) Patent No.: US 6,469,592 B2
(45) Date of Patent: *Oct. 22, 2002

(54) HIGH-FREQUENCY INTERCONNECTION FOR CIRCUITS

(75) Inventors: River Guanghua Huang; Parker Chandler, both of Prior Lake, MN (US)

(73) Assignee: Hei, Inc., Victoria, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/961,627

(22) Filed: Sep. 24, 2001

(65) Prior Publication Data

US 2002/0008598 A1 Jan. 24, 2002

Related U.S. Application Data

(63) Continuation of application No. 09/477,048, filed on Dec. 31, 1999, now Pat. No. 6,294,966.

(51) Int. Cl.$^7$ .................................................. H01P 5/00
(52) U.S. Cl. ........................................ 333/33; 333/247
(58) Field of Search ................................. 333/246, 247, 333/33

(56) References Cited

U.S. PATENT DOCUMENTS 5,583,468 A  * 12/1996  Kielmeyer et al. ........... 333/33

* cited by examiner

Primary Examiner—Robert Pascal
Assistant Examiner—Joseph Chang
(74) Attorney, Agent, or Firm—Merchant & Gould P.C.

(57) ABSTRACT

An RF microcircuit package and interconnection device is disclosed which minimizes impedance mismatch between circuit elements. Multiple signal via and close proximity ground vias as well as tuned wire bonds are disclosed.

21 Claims, 3 Drawing Sheets

HIGH-FREQUENCY INTERCONNECTION FOR CIRCUITS

REFERENCE TO CO-PENDING APPLICATIONS

This application is a continuation of U.S. patent application Ser. No. 09/477,048, which is entitled Interconnection Device (As Amended), filed on Dec. 31, 1999, and scheduled to issue as U.S. Pat. No. 6,294,966 on Sep. 25, 2001, the disclosure of which is hereby incorporated by reference.

TECHNICAL FIELD

The present invention relates to an interconnection for circuits, and more particularly, to an interconnection for high-frequency circuits.

BACKGROUND

Microcircuit electronic products are typically assembled from individual components assembled into packages. In practice, individual components are picked and placed on a substrate. Substrates may be flexible polymer films or rigid ceramic pieces. Substrates may have multiple layers of circuit traces with interconnections between layers made in the Z direction through vias. Some components can be directly electrically attached to pads on the substrate with solder or adhesive or the like. Other components have connection pads that do not lie in the plane of the surface of the substrate. To accommodate the height of these pads, a technique such as wire bonding is used to route signals between the pads that lie in different planes.

For example, it has been common practice to glue or solder integrated circuits to a ceramic substrate and then to make circuit interconnections with wire bonds between pads on the integrated circuit (IC) and a pad on the substrate. The wire bond is a small loop of wire that leaves the pad on the IC and loops over the edge of the IC and drops to the surface of the substrate. Wire bonds are rapidly stitched onto the IC during production and a typical throughput is 5 wire bonds per second. Both via and wire bonds form acceptable signal paths for the package as long as the signal of interest is low frequency.

However, wire bonds both attenuate and radiate signals beginning in the low gigahertz range. The wire itself has a parasitic inductance, which becomes a significant circuit element in the gigahertz range. The conventional solutions to reducing the attenuation have included both wedge bonding and ribbon bonding. Both of these techniques are efforts to reduce the length of the wire and therefore to reduce the inductance of the wire.

In the wedge technique, the wire is routed at an acute angle off the pads to minimize the total length of the connection. Such connections can be made at a rate of approximately 2–3 bonds per second. Ribbon bonds substitute a flat ribbon wire for the conventional wire used for wire bonding, which has a circular cross section. The ribbon has more parasitic capacitance and less parasitic inductance than a round conductor, which minimizes attenuation. However, successful ribbon wire bonding is critically dependent on component placement. This process is also extremely slow and thus the higher cost.

A similar signal routing problem arises on the substrate itself. In a multi-layered substrate, high frequency or high-speed signal traces typically lie close to a ground plane. As a result, signal paths can be designed with constant nominal impedance using well-known stripline or microstrip techniques for RF signals. However, if the signal path passes in the Z direction then the asymmetry may create an impedance mismatch with an associated attenuation and reflection. Ceramic substrates are particularly prone to this problem because they are brittle and additional thickness in the Z-axis is required for mechanical strength. The increased thickness and high dielectric constant exacerbates the impedance mismatch problems.

Therefore, there is a need for improved interconnection devices and methods for production of high-performance, high frequency circuitry packages.

SUMMARY

One aspect of the present invention is directed to a method of interconnecting a first pad to a second pad. The method comprises providing a wire extending between a first pad and a second pad, the wire forming at least a portion of a signal path; and providing a capacitor, thereby tuning the portion of the signal path formed with the wire to an impedance that substantially matches an impedance of at least one other portion of the signal path at one or more predetermined frequencies.

Another aspect of the invention is an apparatus for connecting a first portion of an electrical circuit to a second portion of an electrical circuit. The apparatus comprises a wire providing electrical communication between the first and second portions of the electrical circuit. The wire forms at least a portion of a signal path. A capacitor is electrically proximate the wire. The capacitor provides the wire with a characteristic impedance over a design bandwidth, wherein the characteristic impedance substantially matches an impedance of at least one other portion of the signal path at one or more predetermined frequencies.

BRIEF DESCRIPTION OF THE DRAWINGS

Throughout the several views of the drawings one possible embodiment of the invention is shown wherein.

DETAILED DESCRIPTION

Figure 1:
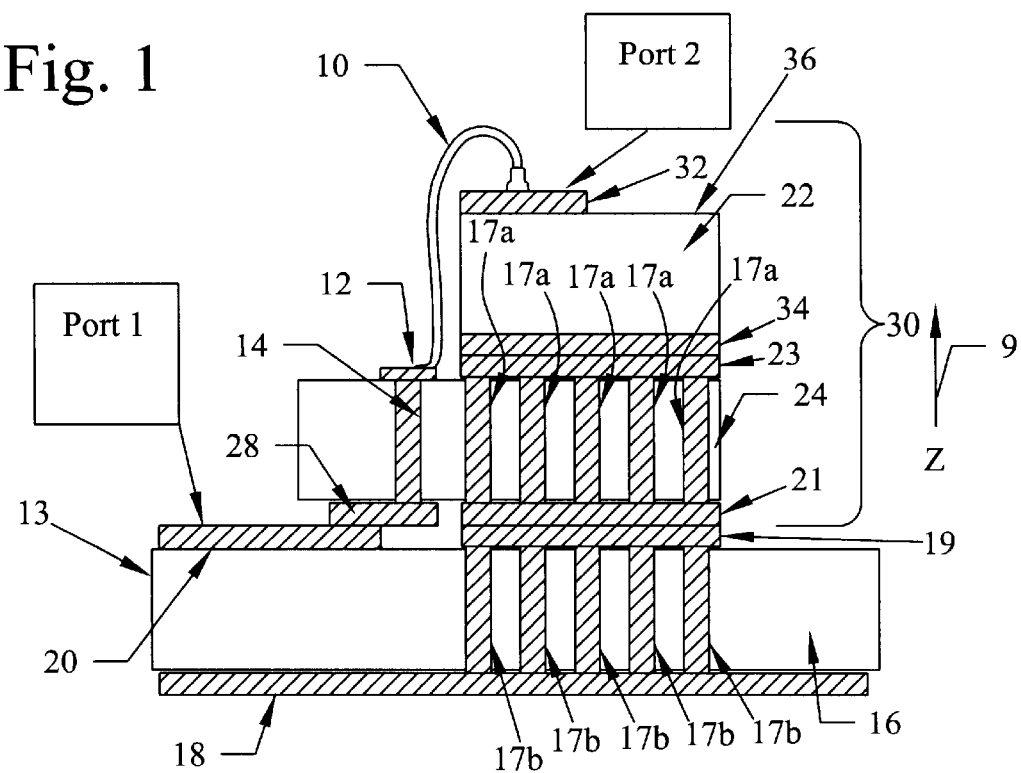
FIG. 1 is a cross section view of a package using aspects of the invention.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Figure 2:
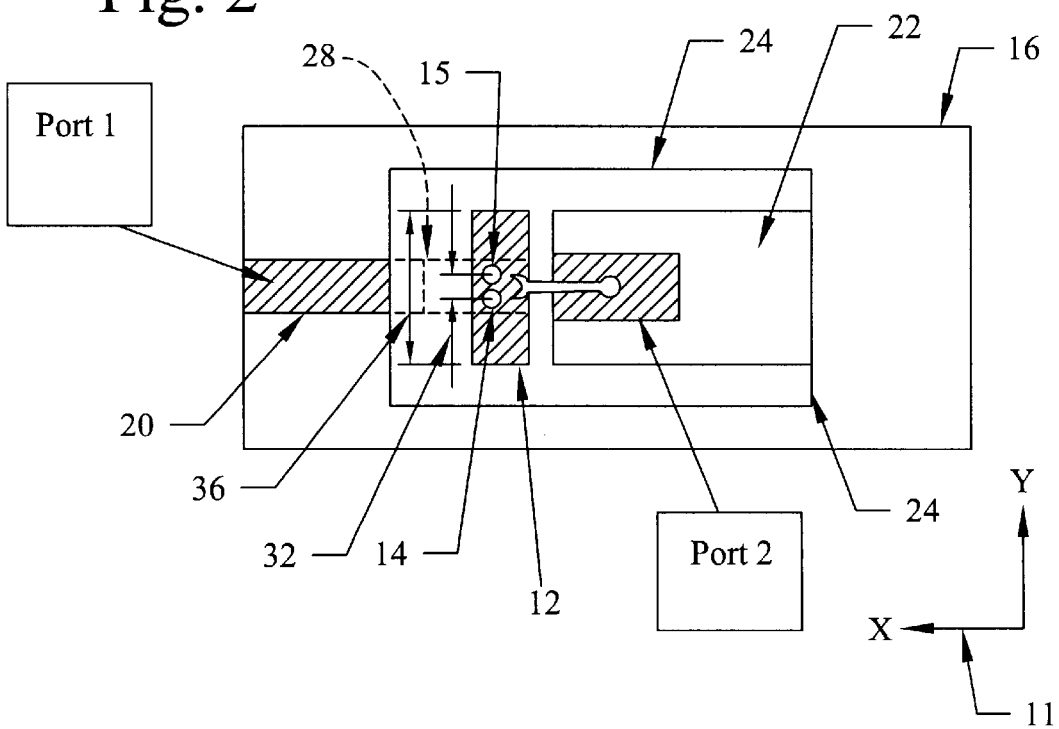
FIG. 2 is a plan view of a package using certain aspects of the invention.

FIGS. 1 and 2 show one possible embodiment of a package 30 in cross section, although the invention can be used with other applications where an interconnect is required, including circuit applications other than packages. As illustrated in the figures, the package 30 is mounted on a circuit board 13. The arrow 9 indicates the Z-axis in this figure. The arrow 11 identifies the X- and Y-axes for this configuration. The package 30 can have many layers and interconnects between the various layers of substrates. For purposes of clarity, however, only a one-layer structure is shown and described herein.

The circuit board 13 includes a substrate 16, which may be made from a variety of materials including inorganic and organic materials, and may be laminated with one or more layers of circuits. Examples of materials that can be used for the substrate include ceramic, polymer, and PTFE (e.g., Teflon®) with a ceramic filler, which imparts a controlled dielectric constant to the PTFE.

An electrically conductive material, such as copper, is mounted on the lower surface of the substrate 16 and forms a ground plane 18. A second ground plane 19 is mounted on the upper surface of the substrate 16, and a plurality of vias 17a extends through the substrate 16 and provides electrical communication between the ground plane 18 and the ground plane 19. A trace 20, which forms a transmission line, also is mounted on the upper surface of the substrate 16 and cooperates with the ground plane 18 to form a signal trace. One skilled in the art can easily compute the width of the trace 20 for any given substrate material and dielectric constant.

A substrate 24 has a ground plane 21 mounted on its lower surface and a ground plane 23 mounted on its upper surface. The ground plane 21 is attached to ground plane 19 using conventional techniques such as solder. A plurality of vias 17a extends through the substrate 24 and provides electrical communication between the ground plane 21 and the ground plane 23. A trace 28 is mounted on the lower surface of the substrate 24. Trace 20 passes under and is attached to the trace 28 using conventional techniques such as solder. As discussed above, the substrate can be formed using a variety of organic and inorganic materials. A bonding pad 12 is also mounted on the upper surface of the substrate 24.

In the embodiment that is illustrated, an integrated circuit 36 is mounted on the substrate 24. An example of an integrated circuit 36 is a microwave integrated circuit or MMIC. The integrated circuit 36 includes a substrate 22 that has a ground plane 34 mounted on a lower surface and a bonding pad 32 mounted on a top surface.

The integrated circuit 36 is positioned so that the ground plane 34 lies against and is attached to the ground plane 23 using conventional techniques such as solder. The structure of this embodiment provides electrical communication between the ground plane 34, the ground plane 23, the ground plane 21, the ground plane 19, and the ground plane 18 so that they are held at substantially the same electrical potential. A wire 10 is bonded to and provides a signal path connection from the bonding pad 32 to the bonding pad 12. Although the integrated circuit 36 is illustrated and described, the interconnects described herein can be used with other structures that are mounted on a package substrate 24.

In one possible embodiment as shown in the figures, the bonding pad 12 has an exaggerated width labeled as 36. The bonding pad 12 has capacitance with respect to the ground plane 18 and the edge of the ground plane 23 The capacitance of the bonding pad 12 tunes the inductance of the wire 10 to produce a predetermined or design characteristic impedance of the interconnection between the integrated circuit 36 and the bonding pad 12.

The bonding pad 12 also might have capacitance with respect to the ground planes 19, 21, and 34, one or more of the vias 17a, or any other grounded structure that is proximal to the bonding pad 12. Whether there is a capacitive effect with a grounded structure, such as a ground plane or a via, depends on a variety of factors. Examples of such factors include the material between the bonding pad 12 and the structures, the distance between the bonding pad 12 and the structures, and the amount of opposing surface area between the bonding pad 12 and the structures.

Although the bonding pad 12 is shown extended along the Y-axis forming a T-shaped connection, other shapes are possible. It is a characteristic of many circuits, such as radio frequency (RF) integrated circuits, that the density of interconnections is low and the periphery of the die is available for such alternative structures. Nevertheless, it is also possible to use structures other than a T-shaped connection and to use circuits having a high density of interconnects.

The T shape of the bonding pad 12 and the wire 10 takes advantage of the close ground plane at the base or lower side of most integrated circuits. The equivalent circuit is a capacitor from the inductance of the wire to ground forming a predetermined characteristic impedance lumped transmission line in the signal path.

A first signal via 14 and a second signal via 15 are separated by a distance 32 and together form a signal path in the Z direction to take the signal from the trace 20 to the bonding pad 12 on the upper surface of substrate 24. The first and second signal vias 14 and 15 are positioned near at least one of the ground vias 17a. In the structure of this embodiment, a signal such as a RF signal travels along both the first and second signal vias 14 and 15 as it propagates from the bonding pad 12 to the trace 28. The structure disclosed herein forms a signal path along which a signal propagates through trace 20, trace 28, signal vias 14 and 15, bonding pad 12, wire 10, and bonding pad 32.

There is a capacitive effect between the first and second signal vias 14 and 15, and between the first and second signal vias 14 and 15 and at least one of the ground vias 17a. The ground via or ground vias 17a that have a capacitive effect with the first and second signal vias 14 and 15 are companion vias. The two signal vias 14 and 15 and the companion ground vias taken together form a constant characteristic impedance connection in the Z-axis between the transmission line 20 and the bonding pad 12.

The characteristic impedance of the signal vias 14 and 15 depends on a variety of factors. These factors include the shape and dimensions of the signal vias 14 and 15, the distance between the first and second signal vias 14 and 15, the dielectric constant of the substrates 24 and 16, the proximity of the companion ground via 17a, and the proximity of other ground features. It is possible that no exact relationship between the factors will exist because of the proximity of other stray capacitance and proximity of other ground structures.

There are many other possible embodiments of the via-type interconnect. For example, more than one signal via may be desirable given a specific package design. When two or more signal vias are used, the signal vias can be placed electrically adjacent to any number of ground vias 17a. Additionally, the signal via 14, the signal via 15, and the ground vias 17a can have other positions relative to one another and different distances between one another to adjust the capacitance in the signal vias 14 and 15 and tune the impedance of the signal path.

During performance testing of the embodiment disclosed herein, a RF signal is injected into port 1 (trace 20) and extracted from port 2 (bonding pad 32). The amount of RF power injected into the circuit is taken as unity and the amount of power extracted is compared to the injected power to measure an insertion loss.

The amount of power extracted at port 2 depends on the quality of the various connections between port 1 and port 2 and the tests measure the reflection coefficient and insertion loss between the ports. Insertion loss contributes to poor performance, and thus a low insertion loss corresponds to better performance. Reflected energy due to impedance mismatch also contributes to reduced performance. Reflection coefficient is a measure of this parameter. Reflection coefficient is conventionally measured as a negative number and so a higher value of reflection coefficient corresponds to better performance. The measurements of reflection coefficient and insertion loss are made in decibels (dB) and are functions of frequency. They are usually plotted as decibels against frequency. Broadband performance is highly desirable especially for newer digital phone technology where broad bandwidth is available. Broadband performance is highly desirable especially for newer digital phone technology where broad bandwidth is available.

Figure 3:
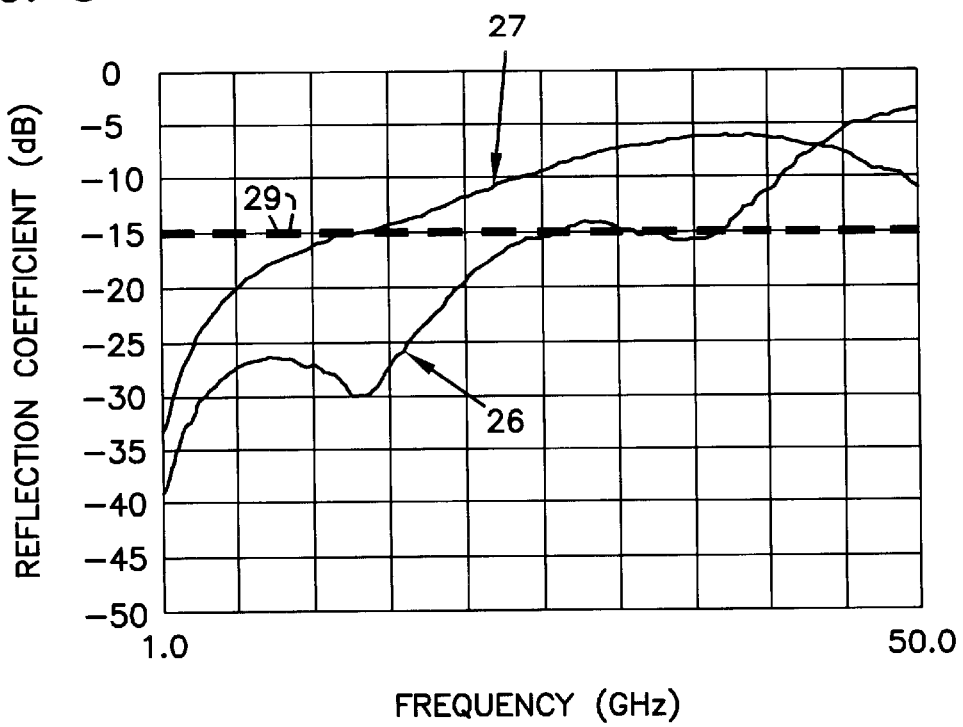
FIG. 3 is a graph showing reflection coefficient test results taken for prototype packages.

In general, the two topologies shown in FIGS. 1 and 2 were explored on composite test packages and the data is averaged for these tests. FIG. 3 shows the measured reflection coefficient of the package described herein as line 26. This performance is compared to a similar package that does not embody the invention labeled. The performance of the test package that does not embody the invention is described as line 27. The −15 dB line 29 is taken as the performance limit for comparison purposes. In general, if the return loss is above −15 dB the signals are so degraded as to render the package impractical.

The test package embodying the invention does not reach the −15 dB point until approximately 36-gigahertz. By contrast, the conventional technology reaches the −15 dB point at 13 GHz. Thus, the package of the invention is capable of higher frequency operation. It is also important to note that the frequency range is very large which is a requirement for broadband operation.

Figure 4:
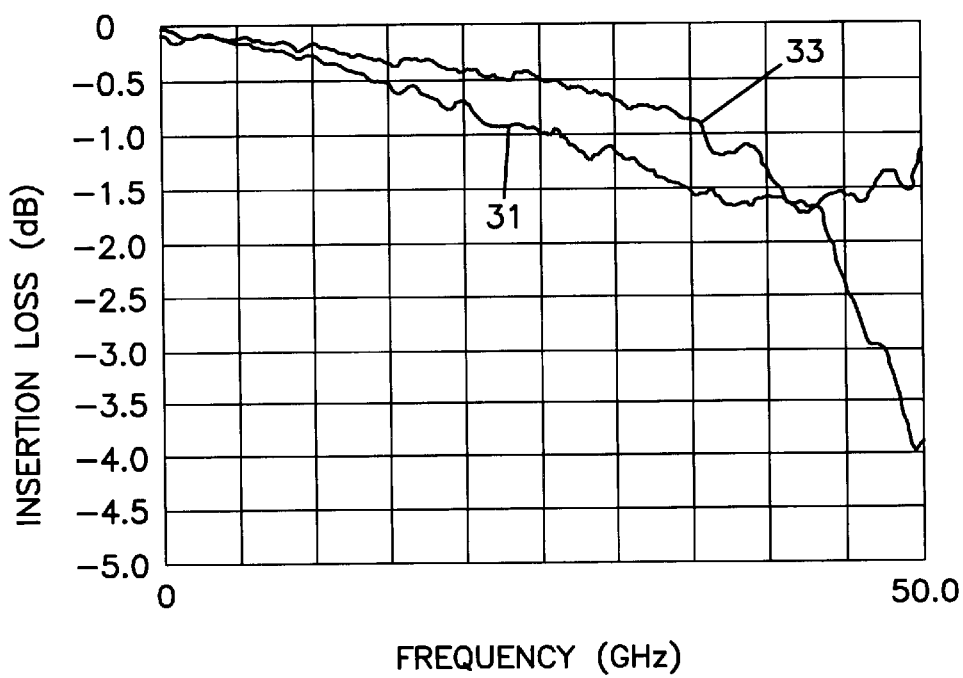
FIG. 4 is a graph showing insertion loss test results taken for prototype packages.

FIG. 4 shows the insertion loss characteristic for the package. The line 33 represents performance of the test package that embodies the invention while line 31 represents the results of the conventional technique. Line 33 lies above line 31 until about the 40 GHz point and demonstrates lower insertion loss for the test package that embodies the present invention. Additionally, FIG. 4 shows that the test package that embodies the present invention attenuates the out of band noise more than the conventional package. This low insertion loss in the passband coupled with increased attenuation for out of passband energy is especially useful in high performance communication products such as cellular phones and the like.

Figure 5:
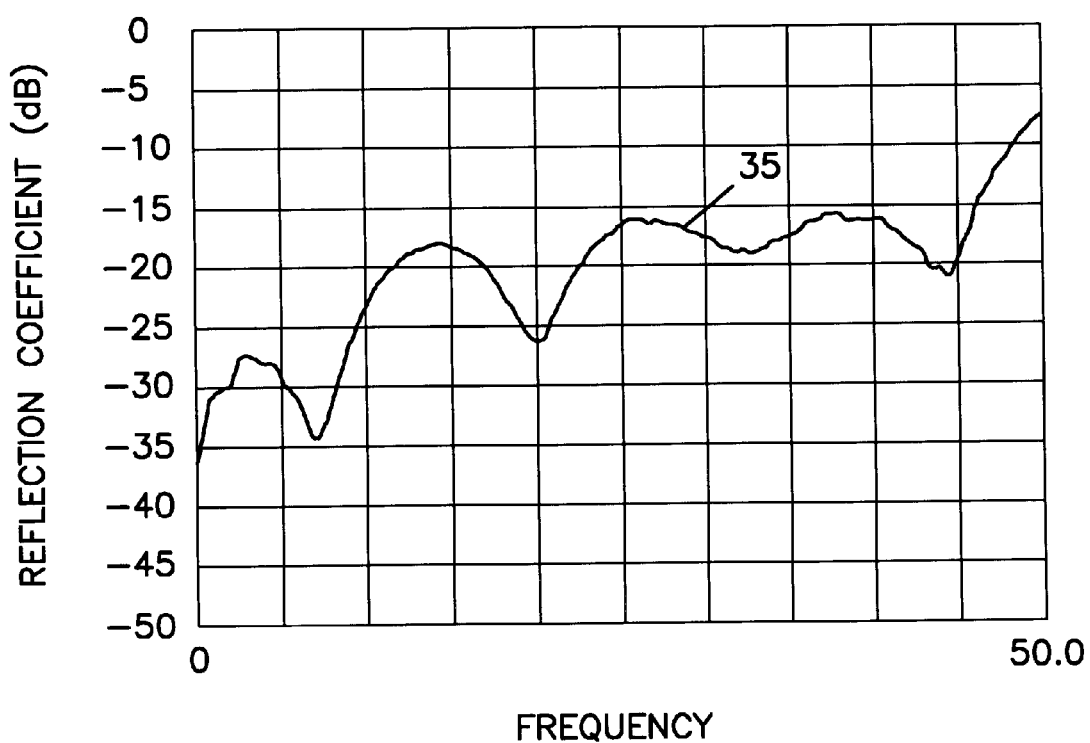
FIG. 5 is a graph showing performance of a package using laminate substrates.

FIG. 5 shows the result of the test package described herein and embodying the present invention in which substrates 22 and 24 are made with laminate substrates and substrate 16 is made with Teflon® brand PTFE filled ceramic material. In this figure, performance of the test package is illustrated as line 35 and offers superior performance in the millimeter wavelength range of 50 gigahertz.

Various embodiments of the invention are shown together to make up a high performance package capable of processing signals, including RF signals. However, each concept may be used alone or combined with other techniques without departing from the scope of the invention. It should also be apparent that other modifications may be made without departing from the scope of the invention. Accordingly, the various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

The claimed invention is:

1. A method of interconnecting a first pad to a second pad, the method comprising:

providing a wire extending between a first pad and a second pad, the wire forming at least a portion of a signal path; and providing a capacitor, thereby tuning the portion of the signal path formed with the wire to an impedance that substantially matches an impedance of at least one other portion of the signal path at one or more predetermined frequencies.

2. The method of claim 1 wherein providing a wire between a first pad and a second pad includes:

providing a wire extending between a first pad on a first plane and a second pad on a second plane.

3. The method of claim 2 wherein providing a wire includes:

providing a wire having a round cross-section.

4. The method of claim 1 wherein providing a capacitor includes:

shunting the signal path with the capacitor.

5. The method of claim 4 wherein shunting the signal path with the capacitor includes:

shunting the signal path to ground.

6. The method of claim 5 wherein providing a capacitor includes:

providing a substrate, the first pad being mounted on a surface of the substrate;

providing a ground, the ground being proximal to the first pad, wherein the first pad forms a capacitor shunted to ground.

7. The method of claim 5 wherein providing a capacitor includes:

providing a dielectric substrate, the first pad being positioned on one side of the dielectric substrate; and providing a ground plane positioned on the oppositely disposed side of the dielectric substrate.

8. The method of claim 1 wherein providing a capacitor, thereby tuning the portion of the signal path formed by the wire includes:

tuning the wire so that a signal passed through the wire has a reflection coefficient of about −15 dB or less for at least one predetermined frequency at or above about 20 GHz.

9. The method of claim 1 wherein providing a capacitor, thereby tuning the portion of the signal path formed by the wire includes:

tuning the wire so that a signal passed through the wire has a reflection coefficient of about −15 dB or less for at least one predetermined frequency at or above about 30 GHz.

10. A method of interconnecting a first pad to a second pad, the method comprising:

providing a wire extending between a first pad on a first plane and a second pad on a second plane, the wire forming at least a portion of a signal path;

providing a substrate, the first pad being mounted on the substrate; and providing a ground proximal to the first pad, thereby forming a capacitor, the capacitor tuning the wire so that a signal passed through the wire has an insertion loss of about −15 dB or less for at least one predetermined frequency at or above about 30 GHz.

11. An apparatus for connecting a first portion of an electrical circuit to a second portion of an electrical circuit, the apparatus comprising:

a wire providing electrical communication between the first and second portions of the electrical circuit, the wire forming at least a portion of a signal path; and a capacitor electrically proximate the wire, the capacitor providing the wire with a characteristic impedance over a design bandwidth, wherein the characteristic impedance substantially matches an impedance of at least one other portion of the signal path at one or more predetermined frequencies.

12. The apparatus of claim 11 wherein:

the first portion of the electrical circuit includes a bonding pad positioned on a first plane and the second portion of the electrical circuit includes a second bonding pad positioned on a second plane; and the wire has a first end bonded to the first bonding pad and a second end bonded to the second bonding pad.

13. The apparatus of claim 11 wherein the bonds between the first end of the wire and the first bonding pad and the second end of the wire and second bonding pad are selected from the group consisting essentially of a ball bond and a wedge bond.

14. The apparatus of claim 13 wherein the wire has a round cross-section.

15. The apparatus of claim 11 wherein the capacitor shunts to ground the portion of the signal path formed by the wire.

16. The apparatus of claim 11 further comprising a substrate, a bonding pad mounted on the substrate, and a ground positioned proximal to the bonding pad thereby forming a capacitor, at least one end of the wire being bonded to the bonding pad.

17. The apparatus of claim 11 further comprising a dielectric substrate, a bonding pad on one side of the dielectric substrate, and a ground plane on an opposite side of the dielectric substrate, the dielectric substrate, the bonding pad, and the ground plane forming the capacitor.

18. The apparatus of claim 11 wherein the impedance of the wire substantially matches the impedance of the first and second portions of the electrical circuit at one or more predetermined frequencies.

19. The apparatus of claim 18 wherein the wire has a reflection coefficient of less than −15 dB for at least one predetermined frequency at or above about 20 GHz.

20. The apparatus of claim 18 wherein the wire has a reflection coefficient of less than −15 dB for at least one predetermined frequency at or above about 30 GHz.

21. An apparatus for connecting a first portion of an electrical circuit to a second portion of an electrical circuit, the apparatus comprising:

a wire providing electrical communication between the first and second portions of the electrical circuit, the wire forming at least a portion of a signal path; and a substrate, a bonding pad mounted on one the dielectric, and a ground positioned proximal to the bonding pad, thereby forming a capacitor;

wherein the wire has a reflection coefficient of less than −15 dB for at least one predetermined frequency at or above about 30 GHz.

* * * * *

UNITED STATES PATENT AND TRADEMARK OFFICE
CERTIFICATE OF CORRECTION

PATENT NO. : 6,469,592 B2
DATED : October 22, 2002
INVENTOR(S) : Huang et al.

It is certified that error appears in the above-identified patent and that said Letters Patent is hereby corrected as shown below:

Column 5,
Line 16, Please delete the duplicate sentence as follows: "Broadband performance is highly desirable especially for newer digital phone technology where broad bandwidth is available."

Column 8,
Line 27, "on one the dielectric," should read -- on the substrate, --

Signed and Sealed this

Twenty-second Day of July, 2003

JAMES E. ROGAN
*Director of the United States Patent and Trademark Office*